(12) United States Patent
Schwarz

(10) Patent No.: US 6,496,947 B1
(45) Date of Patent: Dec. 17, 2002

(54) BUILT-IN SELF REPAIR CIRCUIT WITH PAUSE FOR DATA RETENTION COVERAGE

(75) Inventor: William D. Schwarz, San Jose, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/426,034

(22) Filed: Oct. 25, 1999

(51) Int. Cl.[7] .................................................. G06F 11/27
(52) U.S. Cl. .......................................... 714/30; 714/733
(58) Field of Search ............................ 714/30, 733, 42, 714/54, 718, 719; 365/201

(56) References Cited

U.S. PATENT DOCUMENTS 5,995,731 A * 11/1999 Crouch et al. ............... 714/718
6,014,336 A * 1/2000 Powell et al. ................ 365/201
6,067,262 A * 5/2000 Irrinki et al. ................ 365/200
6,397,349 B2 * 5/2002 Higgins et al. ................ 714/42

OTHER PUBLICATIONS

IBM Tech. Disc. Bull., "Large Vds Data Retention Test Pattern for DRAMS", Jan. 2, 1991, vol. 33, No. 9, pp. 296–297.*

* cited by examiner

Primary Examiner—Scott Baderman
(74) Attorney, Agent, or Firm—Westman, Champlin & Kelly

(57) ABSTRACT

A single-chip integrated circuit includes a memory array, a built-in self test circuit and a pause circuit. The built-in self test circuit is coupled to the memory array and is adapted to execute a sequence of write and read operations on the memory array. The pause circuit is coupled to and activated by the built-in self test circuit. When activated, the pause circuit pauses the sequence of write and read operations for a pause time period.

14 Claims, 5 Drawing Sheets

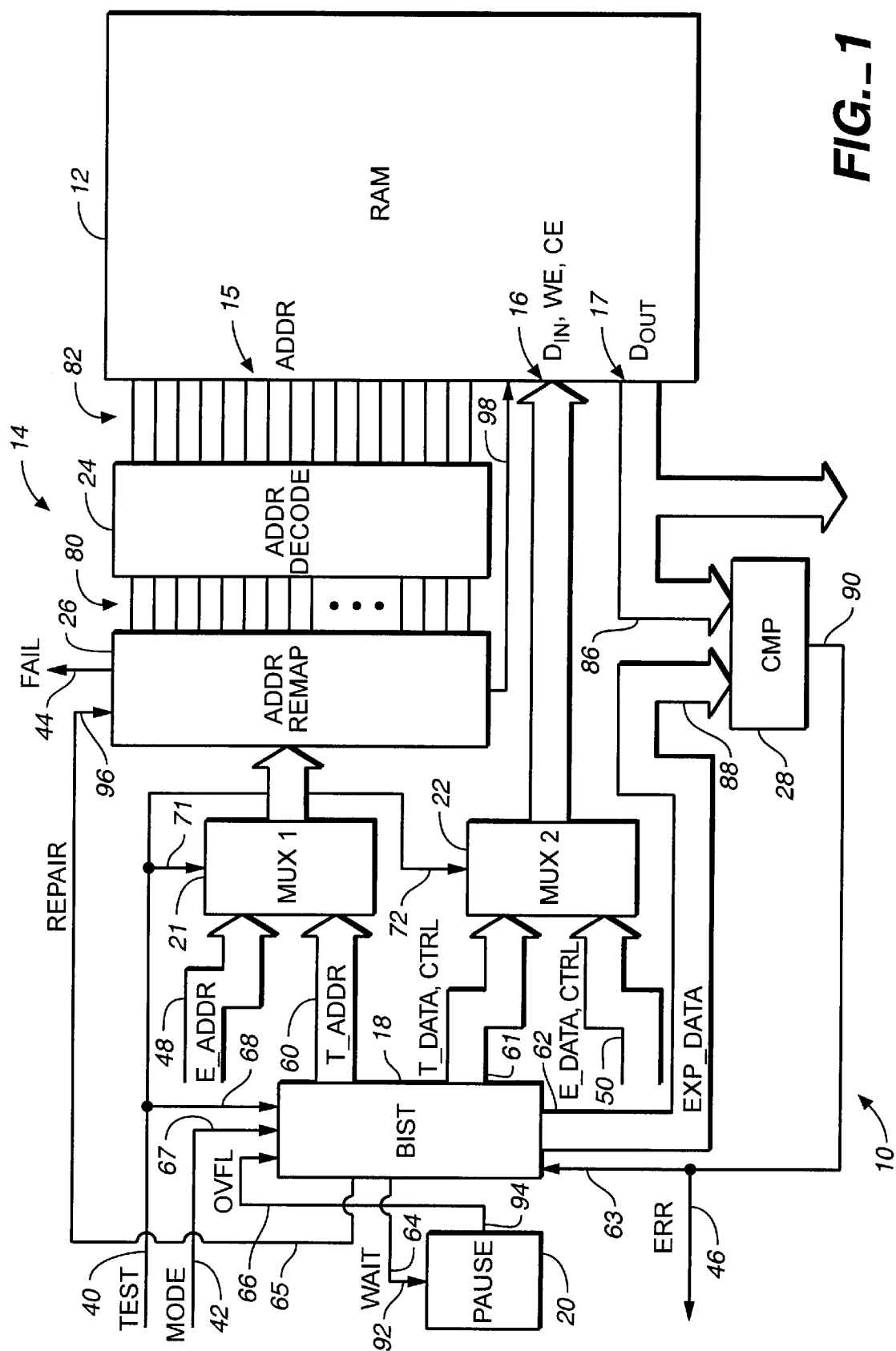
FIG._1

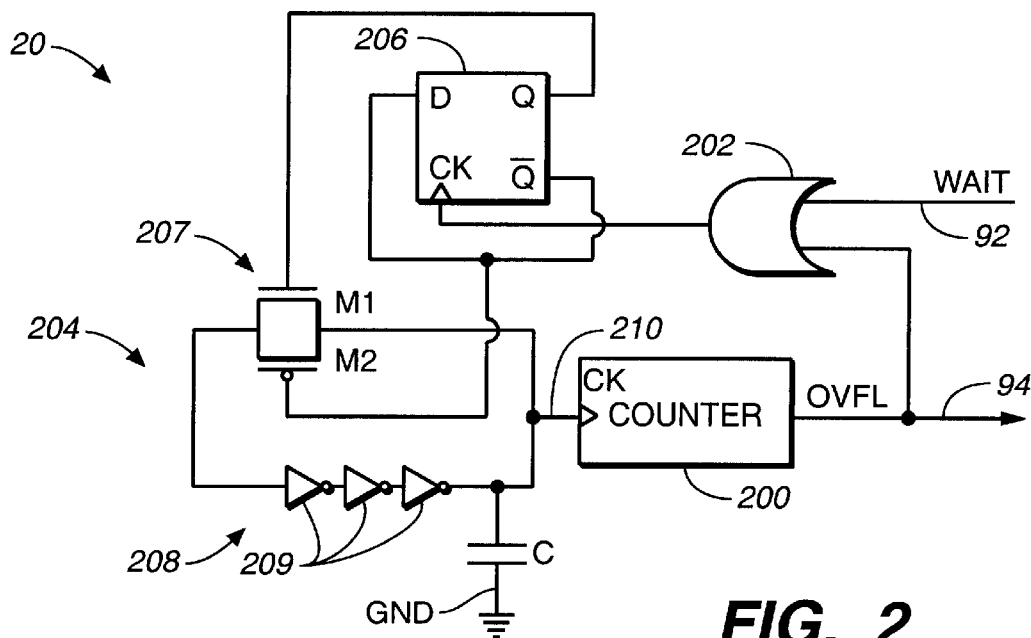
FIG._2
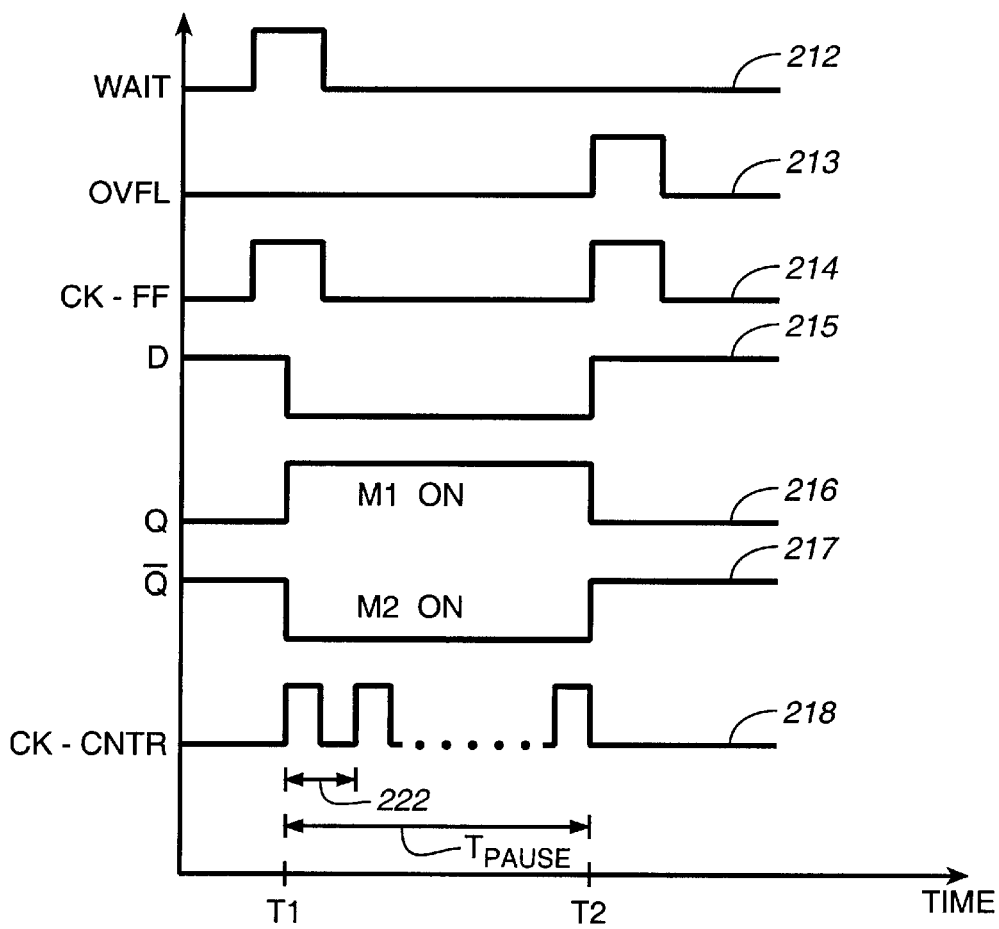
FIG._3

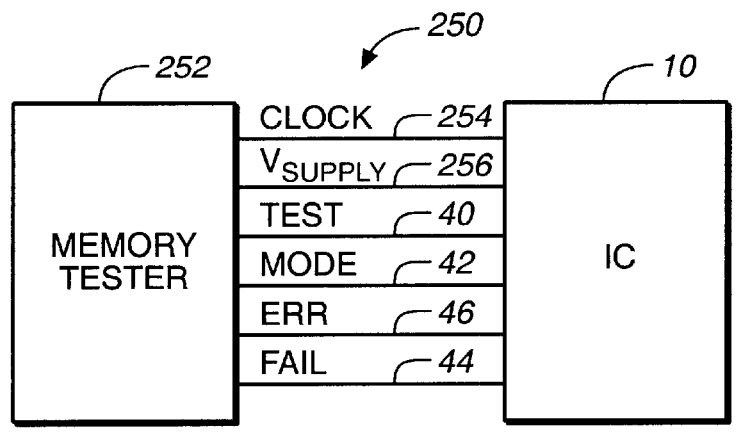
*FIG._4*
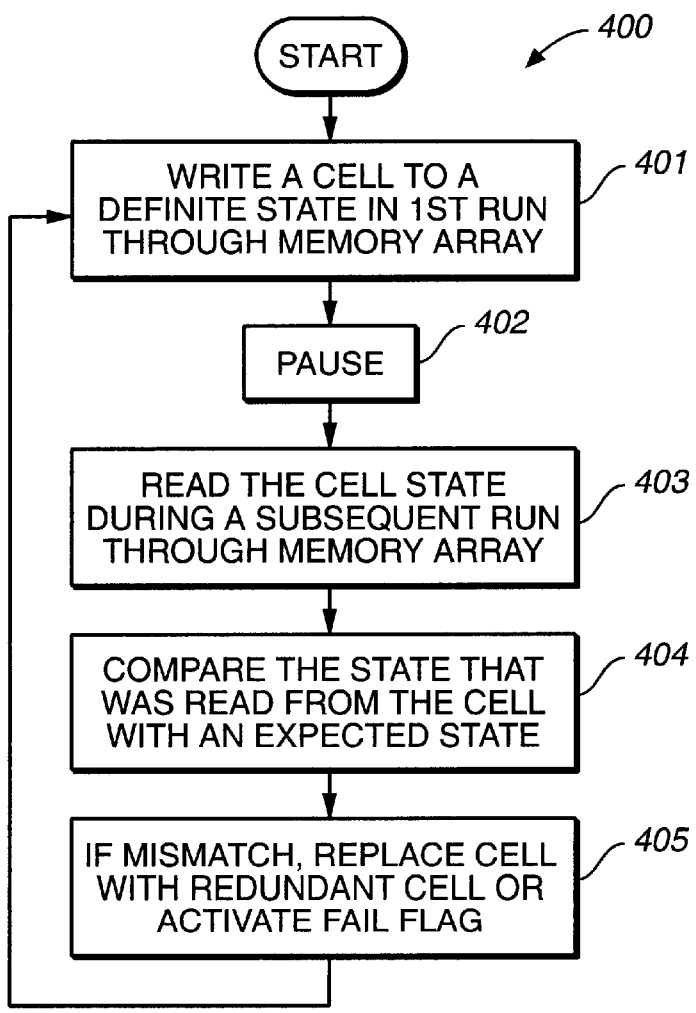
*FIG._6*

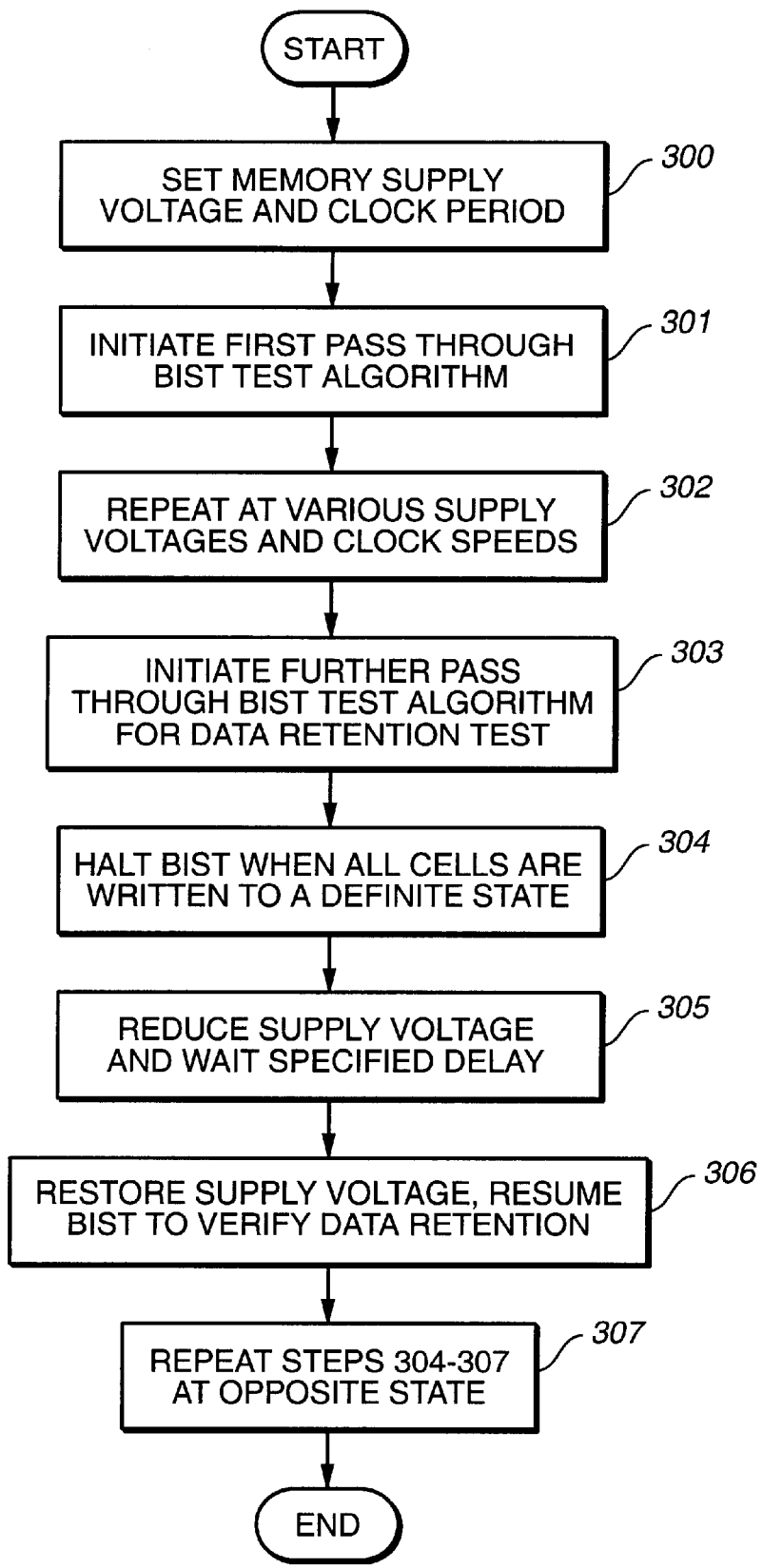
FIG._5

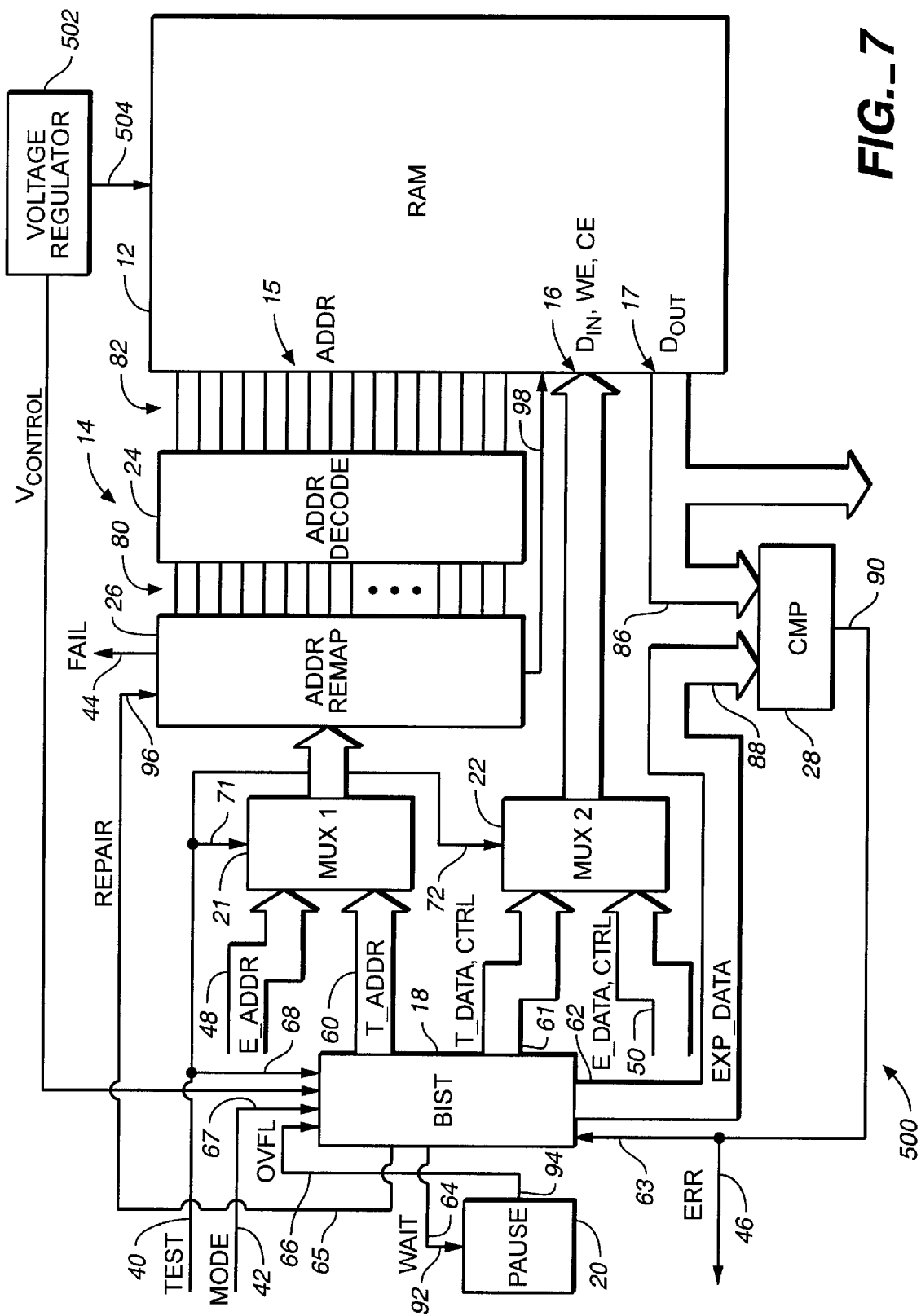
FIG._7

BUILT-IN SELF REPAIR CIRCUIT WITH PAUSE FOR DATA RETENTION COVERAGE

BACKGROUND OF THE INVENTION

The present invention relates to semiconductor integrated circuit memories and, in particular, to memories having built-in self repair ("BISR") circuits.

Semiconductor integrated circuit memories such as static random access memories ("SRAMs") have used BISR circuits to screen for and sometimes repair certain memory failures in the factory and in the field. BISR circuits typically include a state machine, which is fabricated on the integrated circuit with the memory array for implementing a selected test algorithm. This algorithm is initiated in the factory by an external memory tester. In the field, the algorithm is initiated on start-up.

The prevailing method for detecting data retention faults in SRAMs that have BISR circuits is to screen for these faults in the factory. In the factory, the memory and associated BISR circuit are coupled to a memory tester, which provides a supply voltage and a system clock to the memory array and provides control signals to operate the BISR circuit. Typically, memory testers use a two-pass approach through the BISR circuit test algorithm. In the first pass, memory failures are detected and repaired. In the second pass, the repairs are verified.

A common BISR test algorithm consists of several runs through the memory array. The BISR test algorithm performs a sequence of writes and reads on each cell in the memory array, comparing the output of each read with expected data. When a discrepancy is detected, the BISR test algorithm re-maps the memory addresses to replace the row containing the failing cell with a redundant row. These repairs are verified in the second pass through the BISR test algorithm.

During the second pass, the external memory tester also tests the ability of each cell to retain data. After all cells have been written to a definite state by the test algorithm, the external memory tester stops the system clock to halt the test algorithm and lowers the supply voltage provided to the memory array for a sufficient amount of time for weak, leaky or faulty cells to lose their stored charge. The external memory tester then restores the supply voltage and re-starts the system clock to resume the test algorithm. Failing memories are detected by the test algorithm and flagged.

When the memory is installed in the field, the BISR test algorithm is initiated on start-up. It is assumed that all memory failures that were detected and repaired by the BISR circuit in the factory will also be detected and repaired in the field and that all memories with data retention faults were screened out in the factory. However, the inventors of the present invention have found that, in some cases, the first pass through the BISR test algorithm in the factory can mask out certain classes of data retention failures, which prevents them from being detected and repaired in the field. This is due to the fact that, often times, the BISR circuit is clocked at much lower frequencies in the factory than in the field. Since many field systems are now running at extremely high frequencies, the cost or difficulty in making the factory clock match the field clock can be prohibitive.

BISR circuits that are capable of detecting and sometimes repairing certain classes of data retention faults without requiring the factory clock to match the field clock are desired. The present invention addresses these and other problems in the prior art.

SUMMARY OF THE INVENTION

One aspect of the present invention relates to a single-chip integrated circuit, which includes a memory array, a built-in self test circuit and a pause circuit. The built-in self test circuit is coupled to the memory array and is adapted to execute a sequence of write and read operations on the memory array. The pause circuit is coupled to and activated by the built-in self test circuit. When activated, the pause circuit pauses the sequence of write and read operations for a pause time period.

Another aspect of the present invention relates to a method of testing an integrated circuit memory array having a plurality of memory locations and an associated built-in self test (BIST) circuit. The BIST circuit implements a memory test algorithm. The method includes setting the BIST circuit to a field mode and initiating the memory test algorithm while the BIST circuit is in the field mode. The memory test algorithm executes a sequence of write and read operations on the memory array in which each of the plurality of memory locations is accessed at least once during first and second runs through the plurality of memory locations. The BIST circuit inserts a pause in the sequence of write and read operations when the BIST circuit is in the field mode such that a maximum time period between subsequent accesses of each of the memory locations is at least as long as the pause.

Another aspect of the present invention relates to a single-chip integrated circuit, which includes a memory array, a built-in self test circuit coupled to the memory array for executing a sequence of write and read operations on the memory array, and a pause circuit coupled to and activated by the built-in self test means for pausing the sequence of read and write operations.

BRIEF DESCRIPTION OF THE DRAWINGS

FIG. 1 is a block diagram of an integrated circuit memory having a built-in self repair (BISR) circuit according to one embodiment of the present invention.

FIG. 2 is a schematic diagram of a pause timer in the BISR circuit shown in FIG. 1, according to one embodiment of the present invention.

FIG. 3 is a waveform diagram showing various waveforms in the pause timer shown in FIG. 2 over time.

FIG. 4 is a block diagram of a factory test apparatus for testing the integrated circuit memory shown in FIG. 1.

FIG. 5 is a flow chart of a test procedure performed in the factory by the memory tester shown in FIG. 4.

FIG. 6 is a flow chart, which illustrates a method of inserting a pause within a BIST test algorithm implemented by the BISR circuit shown in FIG. 1.

FIG. 7 is a block diagram of an integrated circuit memory having a built-in self repair circuit according to an alternative embodiment of the present invention.

DETAILED DESCRIPTION OF THE PREFERRED EMBODIMENTS

FIG. 1 is a block diagram of an integrated circuit 10 having a memory array 12 and built-in self repair (BISR) circuit 14, according to one embodiment of the present invention. BISR circuit 14 is fabricated with memory array 12 on integrated circuit 10. Memory array 12 can include a static random access memory (SRAM), for example. Other types of memories can also be used. Memory array 12 includes word-line input 15, data and control input 16 and data output 17.

BISR circuit 14 includes built-it self test (BIST) circuit 18, pause timer 20, multiplexers 21 and 22, address decode circuit 24, address re-mapping circuit 26 and compare circuit 28. BISR circuit 14 further includes test enable input 40, field/factory mode input 42, fail flag output 44, error output 46, external address input 48, and external data and control input 50. BIST circuit 18 includes test address output 60, test data and control output 61, expected data output 62, error input 63, wait output 64, repair output 65, overflow input 66, mode input 67 and test enable input 68.

External address input 48 and external data and control input 50 provide the address, data and control to memory array 12 during normal operation. These inputs are driven by input pins or other circuitry (not shown) on integrated circuit 10. External address input 48 and external data and control input 50 are coupled to a first of two data inputs of multiplexers 21 and 22, respectively. The second data inputs of multiplexers 21 and 22 are coupled to test address output 60 and test data and control output 61, respectively, of BIST circuit 18. Multiplexers 21 and 22 control whether memory array 12 is operated by external circuitry or by BIST circuit 18 based on a test enable signal received on input 40, which is coupled to multiplexer select inputs 71 and 72.

The data output of multiplexer 21 is coupled to the input of address re-mapping circuit 26, which provides a re-mapped address 80 to the input of address decode circuit 24. Address decode circuit 24 provides a plurality of word lines 82 to word-line input 15 of memory array 12 for driving selected rows in the memory array. The data output of multiplexer 22 is coupled to data and control input 16 of memory 12. In one embodiment, data and control input 16 includes data input DIN, write enable input WE and chip enable input CE.

Data output 17 of memory array 12 is coupled to output pins or other circuitry (not shown) on integrated circuit 10 and is also coupled to input 86 of comparator circuit 28. Input 88 of comparator circuit 28 is coupled to expected data output 62 of BIST circuit 18. Output 90 of comparator circuit 28 is coupled to error input 63 of BIST circuit 18 and to error output 46.

Pause timer 20 has a timer enable input 92, which is coupled to wait output 64 of BIST circuit 18, and an overflow output 94, which is coupled to overflow input 66 of BIST circuit 18. Repair output 65 of BIST circuit 18 is coupled to repair control input 96 of address re-mapping circuit 26.

During normal operation, test enable input 40 is inactive, which disables BIST circuit 18 and controls multiplexers 21 and 22 to couple external address input 48 and external data and control input 50 to memory array 12 for accessing selected memory locations. Address re-mapping circuit 26 receives the selected address from multiplexer 21 and, based on the address, re-maps the selected row to avoid faulty memory cells in memory array 12. In one embodiment, memory array 12 is fabricated with redundant rows, which are driven by redundant word lines 98 that are normally not driven. Address re-map circuit 26 selectively drives redundant word lines 98 to avoid the faulty memory cells, as is known in the art.

In test mode, test enable input 40 is active, which activates BIST circuit 18 and multiplexers 21 and 22 select test address output 60 and test data and control output 61 for driving memory array 12. BIST circuit 18 includes a state machine, for example, which implements a built-in self test algorithm for testing each cell of memory array 12. BIST circuit 18 can include a state machine or finite controlled system similar to the commercially available RAM BISTs provided by LSI Logic Corporation of Milpitas, Calif. or LogicVision, Inc. of San Jose, Calif., for example. However, BIST circuit 18 further includes additional features and functions to allow certain classes of data retention faults to be detected and repaired in the field. Other circuits either hard-wired or driven by software can be used to implement the test algorithm.

BIST circuit 18 controls outputs 60 and 61 to perform a sequence of writes and reads on memory array 12. The test algorithm sequences through each address location of memory array 12 and performs several write and read operations at each location. For example, the test algorithm can initially write a test pattern to memory array 12 such that each memory cell has a definite state. The test algorithm then reads the stored data (i.e. logic state) from each memory cell, writes the opposite state to the memory cell and then reads the stored, opposite state from the memory cell. As each cell or address location is read, compare circuit 28 compares the data that was read with expected data provided by BIST circuit 18 on output 62. The test algorithm then moves on to the next cell or address location in the array. The test algorithm can run through the addressed locations in memory array 12 multiple times and in various orders, with multiple test patterns being written to and read from the array. This type of test algorithm is commonly referred to as a March-type test algorithm.

If the data read from a particular cell or address of memory array 12 does not match the expected data, compare circuit 28 activates error output 90 to signal that the memory cell or location being tested is faulty. When BIST circuit 18 detects that error output 90 is active, BIST circuit 18 activates repair output 65, which is coupled to repair control input 96 of address re-mapping circuit 26. Address re-mapping circuit 26 replaces the faulty memory location with a redundant element as described above. This is done by re-mapping the address received at the input of circuit 26 to one of the redundant word lines 98. Alternatively, if the redundant memory locations are addressed by reserved addresses through word lines 82, address re-mapping circuit 26 simply maps the address corresponding to the faulty memory location to one of the reserved addresses. This "repairs" the fault by substituting a new memory location for the faulty memory location.

The faulty memory locations can be repaired as faults are detected. In an alternative embodiment, either BIST circuit 18 or address re-mapping circuit 26 stores the addresses of the faulty memory cells. At a predetermined point in the test algorithm, BIST circuit 18 instructs circuit 26 to re-map the faulty addresses. These repairs can be confirmed through additional runs through memory array 12. If address re-mapping circuit 26 runs out of redundant memory locations (e.g. rows), circuit 26 activates fail flag 44.

Pause timer 20 inserts at least one pause (such as a 1 millisecond pause) between subsequent runs through memory array 12 when field/factory mode input 42 is set to the field mode. Other pause lengths can also be used. BIST circuit 18 inactivates pause timer 20 when mode input 42 is set to the factory mode. As described in more detail below, when in field mode, pause timer 20 allows for a sufficient length of time to pass between subsequent memory accesses such that BIST circuit 18 can detect and repair data retention faults from cells having relatively short leakage times. Memory arrays having faulty cells with relatively long leakage times are screened out in the factory.

In one embodiment of the present invention, in field mode, the test algorithm implemented by BIST circuit 18 halts after the first run through the addresses of memory array 12, when every cell has been set to a definite logic state. BIST circuit 18 then activates wait output 64, which triggers pause timer 20. Pause timer 20 waits for a predetermined pause time period and then activates overflow output 94, which is coupled to overflow input 66 of BIST circuit 18. The active overflow output 94 notifies BIST 18 that it is time to resume the test algorithm by making another run through the addresses of memory array 12. In the second run, the test algorithm reads each cell and then sets each cell to the opposite logic state. BIST circuit 18 then inserts a second pause after the second run through memory array 12. This ensures that each memory cell is tested for data retention with both data polarities.

BIST circuit 18 therefore performs a simplified data retention test in the field by inserting pauses between subsequent runs through the addresses of memory array 12 when in field mode. Pause timer 20 allows the time between accesses of each memory cell to be set independently of the system clock frequency. This ensures that regardless of the system clock frequency, the time between accesses of each memory cell is at least one millisecond, for example. Thus, cells that would lose their data in less than one millisecond are always repaired in the field.

In the factory, the system clock period $T_{FACTORY}$ should therefore be set such that the time between subsequent accesses $\tau_{FACTORY}$ is less than or equal to the selected pause time period (e.g. 1 millisecond), which is not nearly as demanding as forcing the factory clock period $T_{FACTORY}$ to match the field clock period $T_{FIELD}$. If $\tau_{FACTORY}$ is longer than the pause time period, some data retention faults may be detected and repaired in the factory, but not in the field. The factory data retention test that takes place in a second pass through the test algorithm is retained. This test is still necessary to screen out parts that have cells with leakage times greater than one millisecond.

Hence, the data retention tests are now fully effective. Cells with fast leakage time (e.g., less than one millisecond) are always repaired by the BIST test algorithm, both in the factory and in the field, while cells with long leakage times are screened out in the factory.

FIG. 2 is a schematic diagram of pause timer 20 according to one embodiment of the present invention. Pause timer 20 includes counter 200, logic-OR gate 202 and ring oscillator 204, which includes D-type flip-flop 206, pass gate 207 formed by N-type transistor M1 and P-type transistor M2, inverting delay chain 208 formed by an odd number of inverters 209, and capacitor C.

Enable input 92 and overflow output 94 are coupled to the inputs of OR gate 202, while the output of OR gate 202 is coupled to the clock input CK of flip-flop 206. The data input D of flip-flop 206 is coupled to the inverted output /Q of flip-flop 206 and to the gate of transistor M2. The non-inverted output Q is coupled to the gate of transistor M1. Transistors M1 and M2 are connected in series with inverters 209. Capacitor C is coupled between the output of one of the inverters 209 and ground terminal GND. Ring oscillator 204 has an output 210 coupled to the clock input CK of counter 200. Counter 200 generates overflow output 94. Counter 200 is adapted to count by either incrementing to or decrementing from a selected value.

The operation of pause timer 20 is illustrated by the waveform diagram of FIG. 3. Waveform 212 represents the logic state of enable input 92 over time. Waveform 213 represents the logic state of overflow output 94 over time. Waveforms 214–217 represent the logic states of flip-flop inputs and outputs CK, D, Q and /Q, respectively, over time. Waveform 218 represents the clock input CK of counter 200 over time. At time T1, BIST circuit 18 activates enable input 92. This triggers a rising edge 220 on clock input CK of flip-flop 206, which causes the logic high state on data input D to be transferred to output Q (and a low state on output /Q). The high and low states on outputs Q and /Q turn on transistors M1 and M2, allowing the clock input CK of counter 200 to oscillate between low and high logic levels, as shown by waveform 218. This clocks counter 200 at a clock period 220, which is equal to two times the delay of delay chain 208. Counter 200 increments (or alternatively decrements) its count on each rising edge of the clock input CK. When the count reaches the predetermined value at time T2, counter 200 activates overflow output 94. Flip-flop 206 latches the logic low level on data input D to output Q (and a logic high level to output /Q), which turns off transistors M1 and M2 and thus the oscillation at output 210. Counter 200 then resets to its initial count.

The time period $T_{PAUSE}$ between the rising edge of the wait signal and the rising edge of the overflow signal is, $$2T_{DELAY}N_{COUNTER} \qquad \text{Eq. 1}$$

where $T_{DELAY}$ is the delay through delay chain 208 and $N_{COUNTER}$ is the number of counts from the initial count until counter 200 overflows. In one embodiment, $N_{COUNTER}$ is selected such that $T_{PAUSE}$ is approximately one millisecond. Other length delays can also be used in alternative embodiments. In addition, various other counter or delay circuits can be used to generate a desired pause between subsequent memory accesses.

FIG. 4 is a block diagram illustrating a factory test apparatus 250 for testing an integrated circuit memory having a BISR circuit as shown in FIG. 1 according to one embodiment of the present invention. Factory test apparatus 250 includes a memory tester 252, which is coupled to integrated circuit 10. Memory tester 250 provides an adjustable system clock 254 and an adjustable supply voltage 256 to integrated circuit 10 for testing integrated circuit 10 under various operating conditions. Memory tester 252 is also coupled to test enable input 40, mode input 42, error output 46 and fail flag output 44. Memory tester 250 initiates the BIST test algorithm by setting factory/field mode input 42 to indicate factory mode and by activating test enable input 40. Memory tester 252 monitors errors through fail output 44 and error output 46. Additional control and status signals can also be passed back and forth between memory tester 252 and integrated circuit 10, as needed.

FIG. 5 is a flow chart of the test procedure performed in the factory by memory tester 252 on memory array 12, according to one embodiment of the present invention. At step 300, memory tester 252 sets the supply voltage to an initial operating voltage and the system clock to an initial frequency. As mentioned above, the system clock speed is typically lower than the clock speeds at which memory array 12 is operated in the field. This reduces the performance requirements for the tester.

At step 301, memory tester 252 initiates a first pass through the BIST test algorithm by activating test enable input 40 and by setting mode input 42 to indicate the "factory" mode. As discussed above, in a typical March-type test algorithm, the entire memory array is written with a test pattern, wherein each cell is written to a definite state. The test algorithm then performs one or more read and write operations on each cell until all the cells have been accessed. With each read, compare circuit 28 (shown in FIG. 1) compares the actual data read from the cell with the expected data and notifies BIST circuit 18 of any errors. These errors are either repaired through address re-mapping circuit 26 or, if the error can not be repaired such as when there are no more redundant rows in memory array 12, BIST circuit 18 fails memory array 12 by activating fail flag 44. The test algorithm may repeat the above procedure a number of times with various test patterns and in various orders through the address sequence to verify the functionality of RAM 12. Subsequent runs through memory array 12 verify earlier repairs. At step 302, memory tester 252 repeats the BIST test algorithm at various supply voltages and clock speeds. At this point, the basic functionality of memory array 12 has been tested.

At step 303, the memory tester 252 initiates a further pass through the BIST test algorithm to perform a data retention test. Once all cells of memory array 12 have been written to a definite state, memory tester 252 halts the BIST test algorithm, at step 304, by stopping the system clock. At step 305, memory tester 252 reduces the supply voltage and waits for a sufficient amount of time for weak, leaky or faulty cells to lose their stored charge. At step 306, the memory tester restores the supply voltage and restarts the system clock to resume the BIST test algorithm and thereby verify data retention. Discrepancies between the expected data and actual data read from the memory cells are detected by BIST 16 and are flagged. At step 307, memory tester 252 repeats steps 304–306 to test data retention when the memory cells are written to the opposite state.

Memories that pass the factory test procedure shown in FIG. 5 are eventually installed in the field. At this time, field/factory mode input 42 is set to indicate "field" mode. This can be done through a register or by hard-wiring the input to a reference level, for example. At start-up, when integrated circuit 10 is initialized, test enable input 40 is activated, which initiates the BIST test algorithm. It is often assumed that the BIST test algorithm will identify and repair all faulty cells that were identified and repaired during the factory test procedure. Assuming the factory test procedure screened out all memories having data retention failures, the memory should be fully functional after running the BIST test algorithm.

However, if the system clock in the field is much faster than the system clock in the factory, some errors detected and repaired in the factory may not be detected in the field with a typical prior art BISR circuit. For any given cell, the maximum time between memory accesses is given by the following equation, $$\tau = N_{ADD} \cdot N_{OPS} \cdot T_{CLOCK} \quad \text{Eq. 2}$$

where $\tau$ is the maximum time between accesses, $N_{ADD}$ is the number of addresses in memory array 12, $N_{OPS}$ is the number of operations performed at each address (how many reads and writes in the standard march-type algorithm) and $T_{CLOCK}$ is the clock period. Cells that can hold their charge for only a short period of time, which is less than the maximum time between accesses, will fail during the first pass through the BIST test algorithm in the factory and will be repaired by the BISR circuit. In the field, this same cell may not fail since the maximum time between accesses is significantly shorter with a higher frequency clock. This cell will therefore not be repaired in the field as it was in the factory and will almost certainly lead to a memory failure during regular operation.

These problems are avoided in the present invention by performing a simplified data retention test in the field through the modified BISR circuit shown in FIG. 1. As described with reference to FIGS. 1–3, small (such as one millisecond) pauses are inserted during the BIST test algorithm, between subsequent runs through the memory array. As long as the factory clock period is set such that the time between accesses in the BIST test algorithm is less than or equal to the pause length (e.g., one millisecond), cells that would lose their data in less than a millisecond are always repaired in the field. Cells with fast leakage times (e.g., less than one millisecond) are always repaired by the BIST test algorithm, both in the factory and in the field. Cells with long leakage times (e.g., greater than one millisecond) are screened out in the factory.

FIG. 6 is a flow chart which illustrates a method 400 of inserting a pause within the BIST test algorithm according to one embodiment of the present invention. At step 401, a cell is written to a definite state during a first run through the memory array. After the cell has been written to a definite state, BIST circuit 18 activates pause circuit 20 to introduce a short pause in the test algorithm, at step 402. This pause ensures that there is at least a predetermined delay between accesses in subsequent runs through the memory array. At step 403, the cell state is read during a subsequent run through the memory array. At step 404, compare circuit 28 compares the state read from the cell with the expected state. At step 405, if there is an error, address re-map circuit 26 replaces the cell (or row containing the cell) with a redundant cell (or row) If the cell cannot be replaced, fail flag 44 is activated. This should be unlikely in the field since the memory would have already been fully tested in the factory and found to be repairable. The pause at step 402 can be inserted at any convenient location in the BIST test algorithm between subsequent memory cell accesses.

FIG. 7 is a block diagram of an integrated circuit having a memory array and a built-in self repair circuit according to an alternative embodiment of the present invention. The same reference numerals are used in FIG. 6 as were used in FIG. 1 for the same or similar elements. In this embodiment, the data retention test performed in the factory is integrated into BISR circuit 14 by including a voltage regulator circuit 502, which is controlled by BIST circuit 18. Voltage regulator circuit 502 has a supply voltage output 504, which provides the supply voltage for memory array 12. Voltage regulator circuit 502 receives a voltage control input 506 from BIST circuit 18, which sets the supply voltage on output 504. BIST circuit 18 alters voltage control output 506 to reduce the memory supply voltage during the pause at step 402 in FIG. 6. In an alternative embodiment, wait output 64 and overflow output 94 are coupled directly to voltage regulator circuit 502 for controlling the time during which the supply voltage is reduced.

Pause circuit 20 is modified to provide two pause settings, a short pause for the field mode, and a long pause for the factory mode. The long pause can be inserted by BIST circuit 18 during subsequent passes through the BIST test algorithm for performing a dedicated data retention test. In an alternative embodiment, two pause circuits 20 would be provided, one with a relatively short delay and one with a relatively long delay, with each pause circuit being controlled by BIST circuit 18. Other circuit configurations are also possible.

Although the present invention has been described with reference to preferred embodiments, workers skilled in the art will recognize that changes may be made in form and detail without departing from the spirit and scope of the invention. For example, various BIST test algorithms, test circuit configurations and memory test patterns can be used with the present invention. The address re-mapping can be performed in a variety of ways, and can be performed before or after performing the address decode. The configurations shown in the specification are provided as examples only. The term "coupled" used in the specification and in the claims can include a direct connection or a connection through one or more intermediate components.

What is claimed is:

1. A single-chip integrated circuit comprising:

a memory array;

a built-in self test circuit coupled to the memory array and adapted to execute a sequence of write and read operations on the memory array, wherein the built-in self test circuit comprises a mode input having a factory mode state and a field mode state; and a pause circuit, which is coupled to and activated by the built-in self test circuit, wherein the pause circuit, when activated, pauses the sequence for a pause time period, and wherein the built-in self test circuit disables the pause circuit when the mode input is in the factory state and enables the pause circuit when the mode input is in the field state.

2. The single-chip integrated circuit of claim 1 wherein the built-in self test circuit comprises:

a test enable input having an active state and an inactive state, wherein the built-in self test circuit initiates the sequence when the test enable input is in the active state.

3. The single-chip integrated circuit of claim 1 wherein the pause circuit comprises a timer.

4. The single-chip integrated circuit of claim 1 and further comprising:

a voltage regulator coupled to and controlled by the built-in self test circuit and having a variable supply voltage output, which is coupled to a supply voltage input to the memory array.

5. The single-chip integrated circuit of claim 1 and further comprising:

a voltage regulator coupled to and controlled by the pause circuit and having a variable supply voltage output, which is coupled to a supply voltage input to the memory array.

6. The single-chip integrated circuit of claim 1 wherein:

the memory array comprises a plurality of memory locations;

the sequence of write and read operations comprises first and second runs through each of the plurality of memory locations, wherein each memory location is accessed at least once in each of the first and second runs; and the built-in self test circuit activates the pause circuit between the first and second runs.

7. The single-chip integrated circuit of claim 1 wherein:

the memory array comprises a plurality of memory locations;

the sequence of write and read operations comprises first, second and third runs through each of the plurality of memory locations, wherein each memory location is accessed at least once in each of the first, second and third runs; and the built-in self test circuit activates the pause circuit within the second run.

8. A method of testing an integrated circuit memory array having a plurality of memory locations and an associated built-in self test (BIST) circuit, which implements a memory test algorithm, the method comprising:

setting the BIST circuit to a field mode;

initiating the memory test algorithm while the BIST circuit is in the field mode, wherein the memory test algorithm executes a sequence of write and read operations on the memory array in which each of the plurality of memory locations is accessed at least once during first and second runs through the plurality of memory locations; and inserting a pause in the sequence of write and read operations with the BIST circuit when the BIST circuit is in the field mode such that a maximum time period between subsequent accesses of each of the memory locations in the sequence is at least as long as the pause.

9. The method of claim 8 wherein the step of inserting a pause comprises:

suspending execution of the sequence of write and read operations;

generating a wait signal with the BIST;

initiating a timer in response to the wait signal, wherein the timer generates an output after a predetermined time period; and resuming execution of the sequence of write and read operations by the BIST in response to the output from the timer.

10. The method of claim 8 wherein the step of inserting a pause is initiated by the memory test algorithm implemented by the BIST.

11. The method of claim 8 and further comprising:

writing a test pattern to each of the memory locations within the sequence;

reading the test pattern from each of the memory locations within the sequence;

comparing the test pattern read from each of the memory locations with an expected test pattern; and substituting a redundant memory location within the memory array for each of the memory locations for which the test pattern read from that memory location does not match the expected test pattern for that memory location.

12. The method of claim 8 and further comprising:

coupling the memory array and the BIST circuit to an external memory tester;

setting the BIST circuit to a factory mode;

initiating the memory test algorithm with the memory tester while the BIST circuit is in the factory mode; and disabling the step of inserting a pause in the sequence of write and read operations with the BIST circuit, when the BIST circuit is in the factory mode.

13. The method of claim 12 and further wherein the step of initiating the memory test algorithm with the memory tester comprises:

operating the memory array and the BIST circuit with a factory system clock having a factory clock period, wherein the factory clock period is sufficiently short such that a maximum time period between subsequent accesses of each of the memory locations in the sequence, while the BIST circuit is in the factory mode, is less than or equal to the pause.

14. A single-chip integrated circuit comprising:

a memory array;

built-in self test means coupled to the memory array for executing a sequence of write and read operations on the memory array and having a mode input; and pause means coupled to and activated by the built-in self test means for pausing the sequence of read and write operations, wherein the pause means is disabled when the mode input is in a factory state and is enabled when the mode input is in a field state.

* * * * *